United States Patent
Sashida

(10) Patent No.: US 8,558,294 B2
(45) Date of Patent: Oct. 15, 2013

(54) SEMICONDUCTOR DEVICE AND FABRICATION PROCESS THEREOF

(75) Inventor: Naoya Sashida, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/126,357

(22) Filed: May 23, 2008

(65) Prior Publication Data

US 2008/0224194 A1    Sep. 18, 2008

Related U.S. Application Data

(63) Continuation of application No. PCT/JP2005/021714, filed on Nov. 25, 2005.

(51) Int. Cl.
    *H01L 27/105* (2006.01)

(52) U.S. Cl.
    USPC .............. 257/295; 438/3; 438/197; 438/201; 438/238; 438/239; 438/253; 438/396; 438/397; 438/482; 438/486; 257/298; 257/303; 257/306; 257/E21.008; 257/E21.009; 257/E21.208; 257/E21.664; 257/E27.104

(58) Field of Classification Search
    USPC ........... 257/E21.009, E21.664, E27.104, 296, 257/303, 310, E29.008, E21.208, E21.663, 257/295, 298, 306; 438/3, 381, 240, 253, 438/396–398, 254–255, 197, 201, 238, 239, 438/482, 486
    See application file for complete search history.

(56) References Cited

U.S. PATENT DOCUMENTS

| 6,114,199 A * | 9/2000 | Isobe et al. ............... 438/240 |
| 6,218,197 B1 * | 4/2001 | Kasai ........................... 438/3 |
| 6,455,882 B1 * | 9/2002 | Nakura ..................... 257/295 |
| 2001/0012659 A1 * | 8/2001 | Sashida et al. ............ 438/250 |
| 2001/0021554 A1 * | 9/2001 | Hopfner .................... 438/253 |
| 2003/0089954 A1 * | 5/2003 | Sashida ..................... 257/369 |
| 2004/0046185 A1 * | 3/2004 | Sashida ..................... 257/200 |
| 2005/0118795 A1 * | 6/2005 | Hidaka et al. ............. 438/593 |
| 2005/0218443 A1 | 10/2005 | Tamura et al. |

FOREIGN PATENT DOCUMENTS

| CN | 1674286 A | | 9/2005 |
| JP | 2001015696 A | * | 1/2001 |
| JP | 2001-110998 A | | 4/2001 |
| JP | 2002-217381 A | | 8/2002 |

(Continued)

OTHER PUBLICATIONS

International Search Report of PCT/JP2005/021714, date of mailing Jan. 10, 2006.

(Continued)

*Primary Examiner* — Ermias Woldegeorgis
(74) *Attorney, Agent, or Firm* — Westerman, Hattori, Daniels & Adrian, LLP

(57) ABSTRACT

A semiconductor device includes a semiconductor substrate formed with an active element, an oxidation resistant film formed over the semiconductor substrate so as to cover the active element, a ferroelectric capacitor formed over the oxidation resistance film, the ferroelectric capacitor having a construction of consecutively stacking a lower electrode, a ferroelectric film and an upper electrode, and an interlayer insulation film formed over the oxidation resistance film so as to cover the ferroelectric capacitor, wherein there are formed, in the interlayer insulation film, a first via-plug in a first contact hole exposing the first electrode and a second via-plug in a second contact hole exposing the lower electrode, and wherein there is formed another conductive plug in the interlayer insulation film in an opening exposing the oxidation resistant film.

7 Claims, 20 Drawing Sheets

(56) References Cited

FOREIGN PATENT DOCUMENTS

| | | | |
|---|---|---|---|
| JP | 2002-324839 A | 11/2002 | |
| JP | 2004-260062 A | 9/2004 | |
| JP | 2005-26331 A | 1/2005 | |
| JP | 2005026331 A | * 1/2005 | |
| JP | 2005-327989 A | 11/2005 | |
| KR | 10-0395468 B1 | 8/2003 | |

OTHER PUBLICATIONS

Chinese Office Action mailed Sep. 25, 2009, issued in corresponding Chinese Application No. 2005800521328.

Korean Office Action dated Mar. 26, 2010, issued in corresponding Korean Patent Application No. 10-2008-7012409.

* cited by examiner

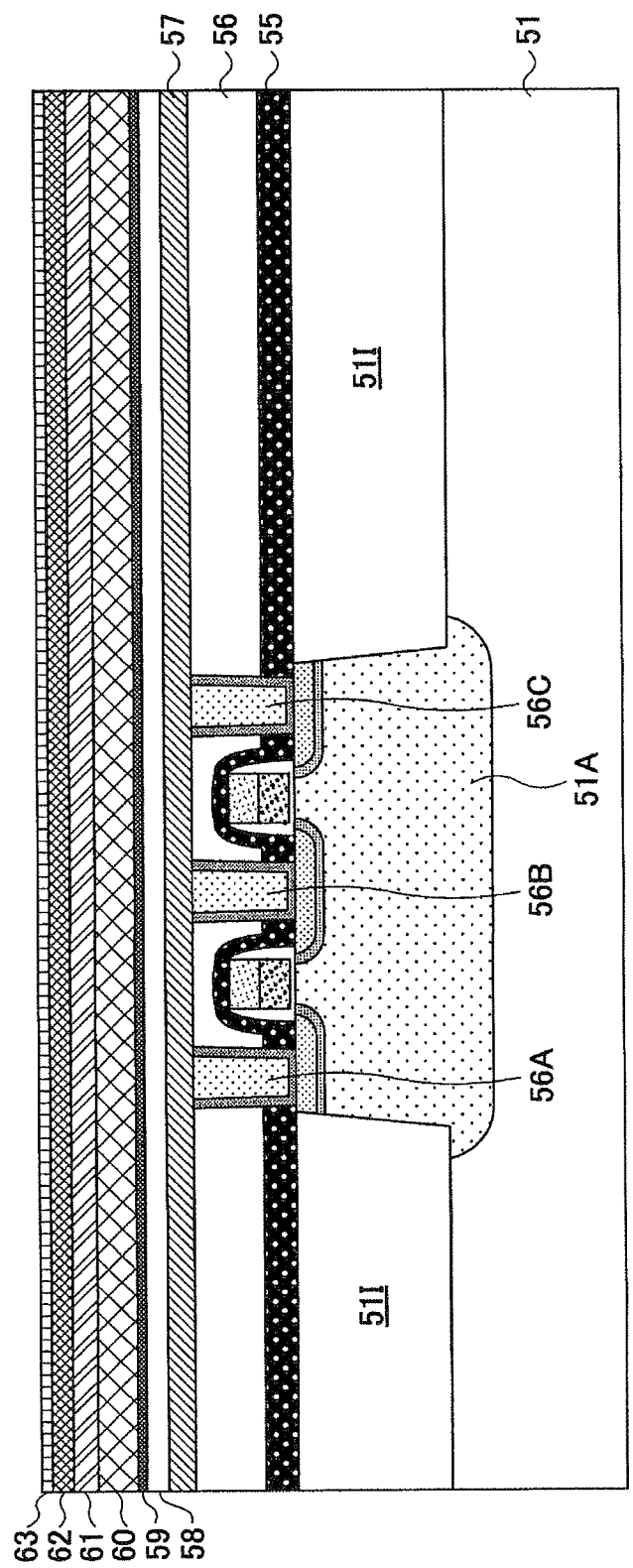

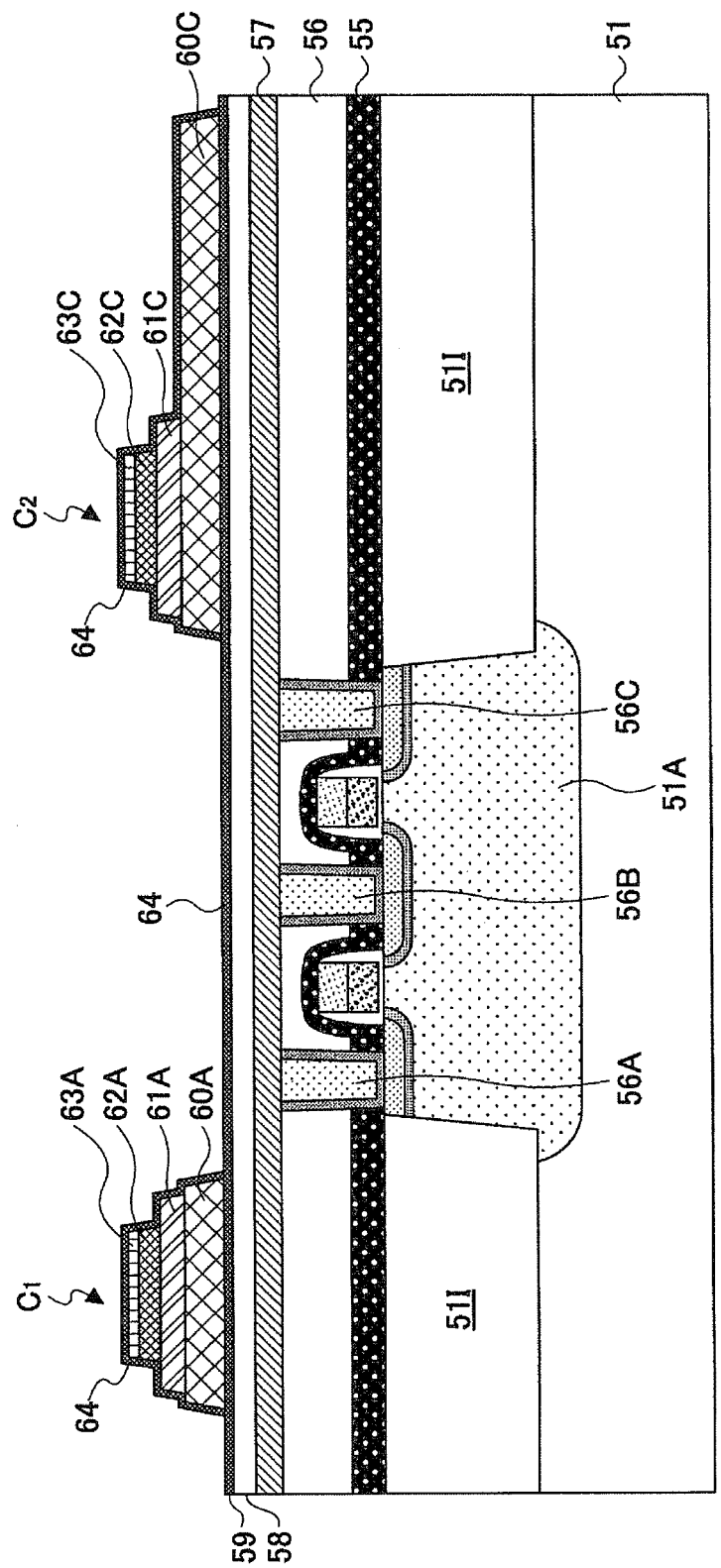

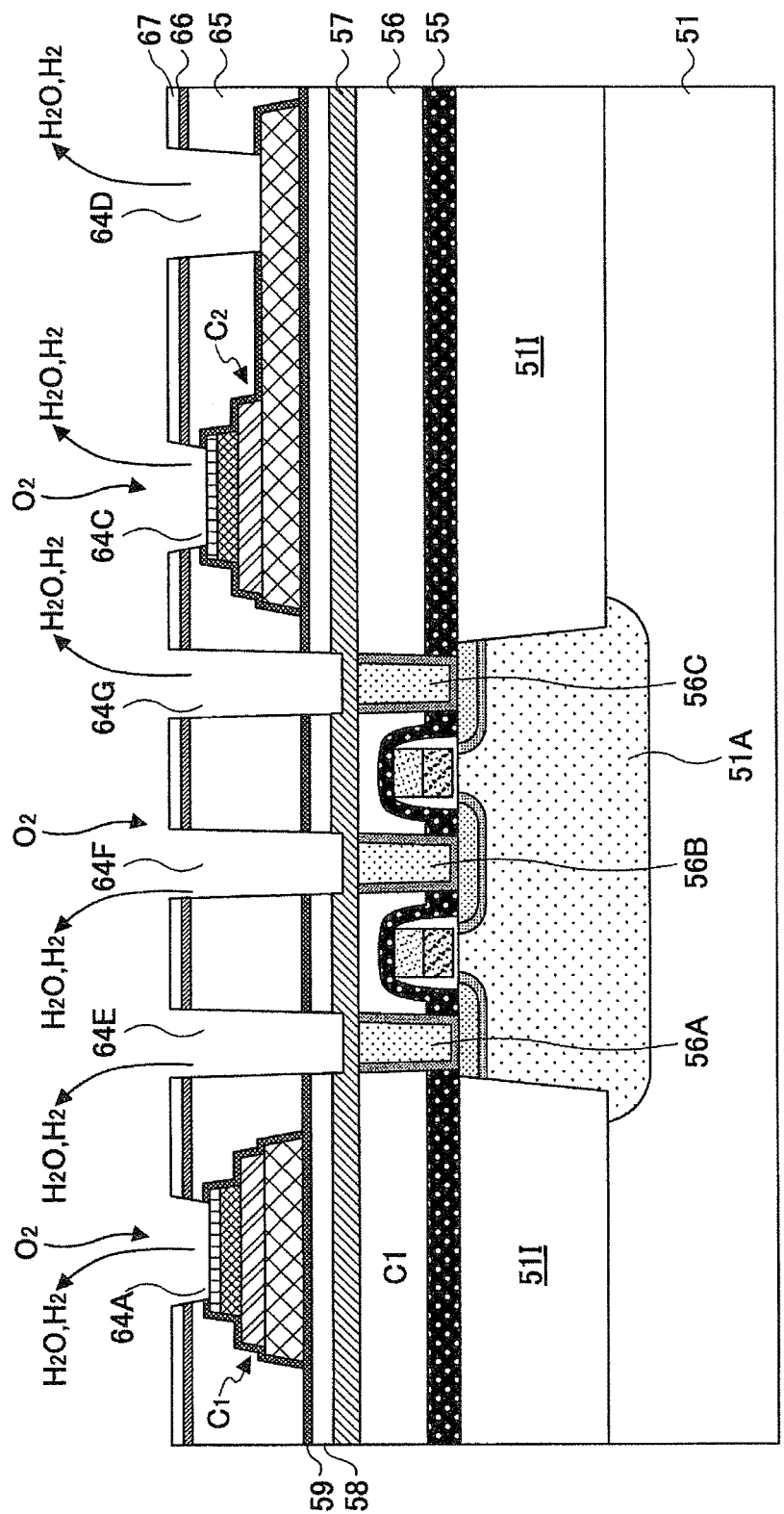

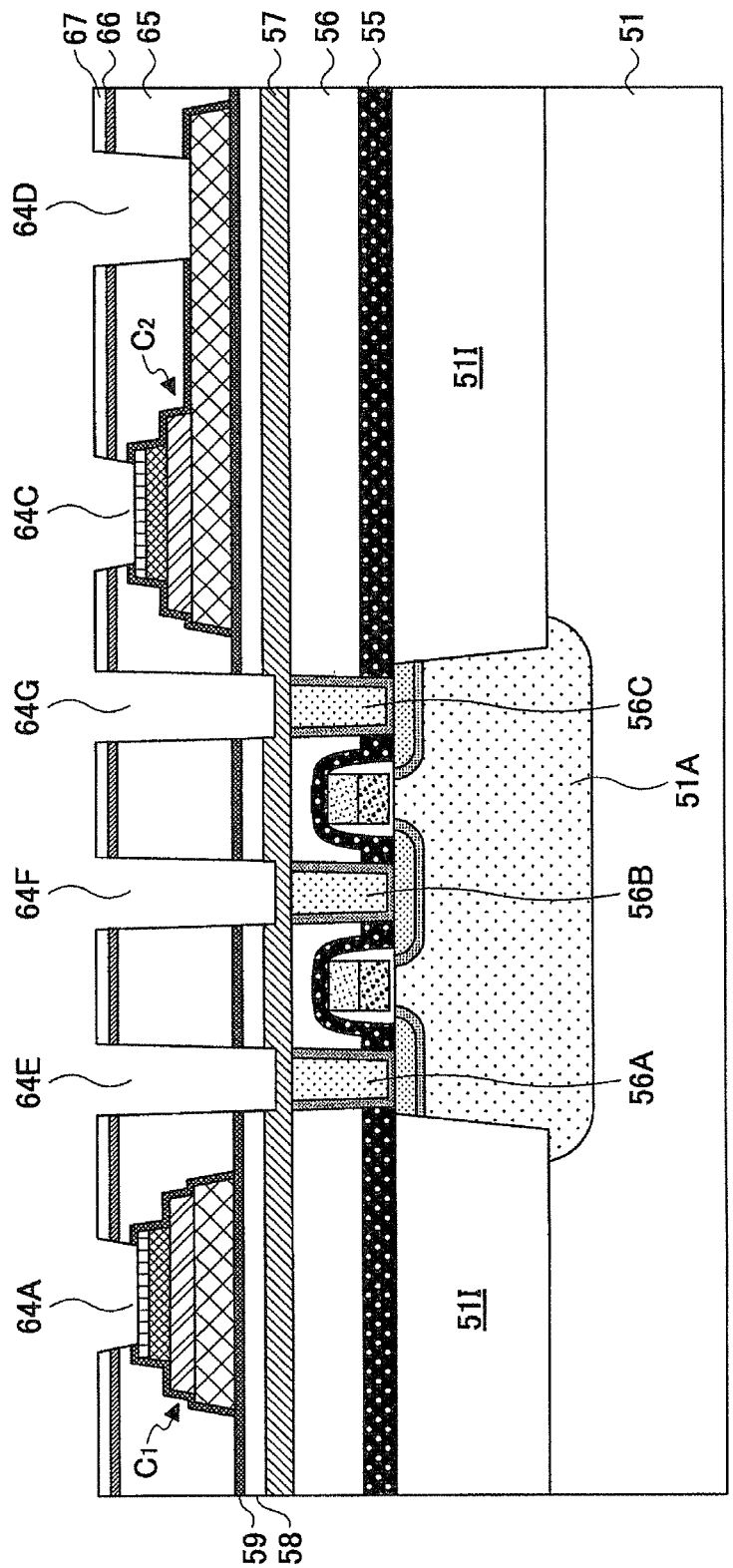

SEMICONDUCTOR DEVICE AND FABRICATION PROCESS THEREOF

CROSS-REFERENCE TO RELATED APPLICATIONS

The present invention is a continuation application filed under 35 U.S.C. 111(a) claiming benefit under 35 U.S.C. 120 and 365(c) of PCT application JP2005/021714 filed on Nov. 25, 2005, the entire contents thereof are incorporated herein as reference.

BACKGROUND

The embodiments discussed herein are directed to semiconductor devices which may include a semiconductor device having a ferroelectric capacitor and fabrication process thereof.

A ferroelectric memory is a non-volatile voltage-driven semiconductor memory device and is characterized by preferable feature of high operational speed, low electric power consumption and non-volatility of information in that the information held therein is retained even when the electric power is turned off. Ferroelectric memories are already used in IC cards and other portable electronic apparatuses.

SUMMARY

It is an aspect of the embodiments discussed herein to provide a semiconductor device, including a semiconductor substrate formed with an active element; an anti-oxidation film formed over said semiconductor substrate so as to cover said active element; a ferroelectric capacitor formed over said oxidation resistance film, said ferroelectric capacitor having a construction of consecutively stacking a lower electrode, a ferroelectric film and an upper electrode; and an interlayer insulation film formed over said oxidation resistance film so as to cover said ferroelectric capacitor, wherein there are formed, in said interlayer insulation film, a first via-plug in a first contact hole exposing said first electrode and a second via-plug in a second contact hole exposing said lower electrode, and wherein there is formed another conductive plug in said interlayer insulation film in an opening exposing said anti-oxidation film.

These together with other aspects and advantages which will be subsequently apparent, reside in the details of construction and operation as more fully hereinafter described and claimed, reference being made to the accompanying drawings forming a part hereof, wherein like numerals refer to like parts throughout.

BRIEF DESCRIPTION OF THE DRAWINGS

FIGS. 11A-11H are diagrams showing the fabrication process of a ferroelectric memory device of FIG. 10;

DETAILED DESCRIPTION OF THE PREFERRED EMBODIMENT

Figure 1:
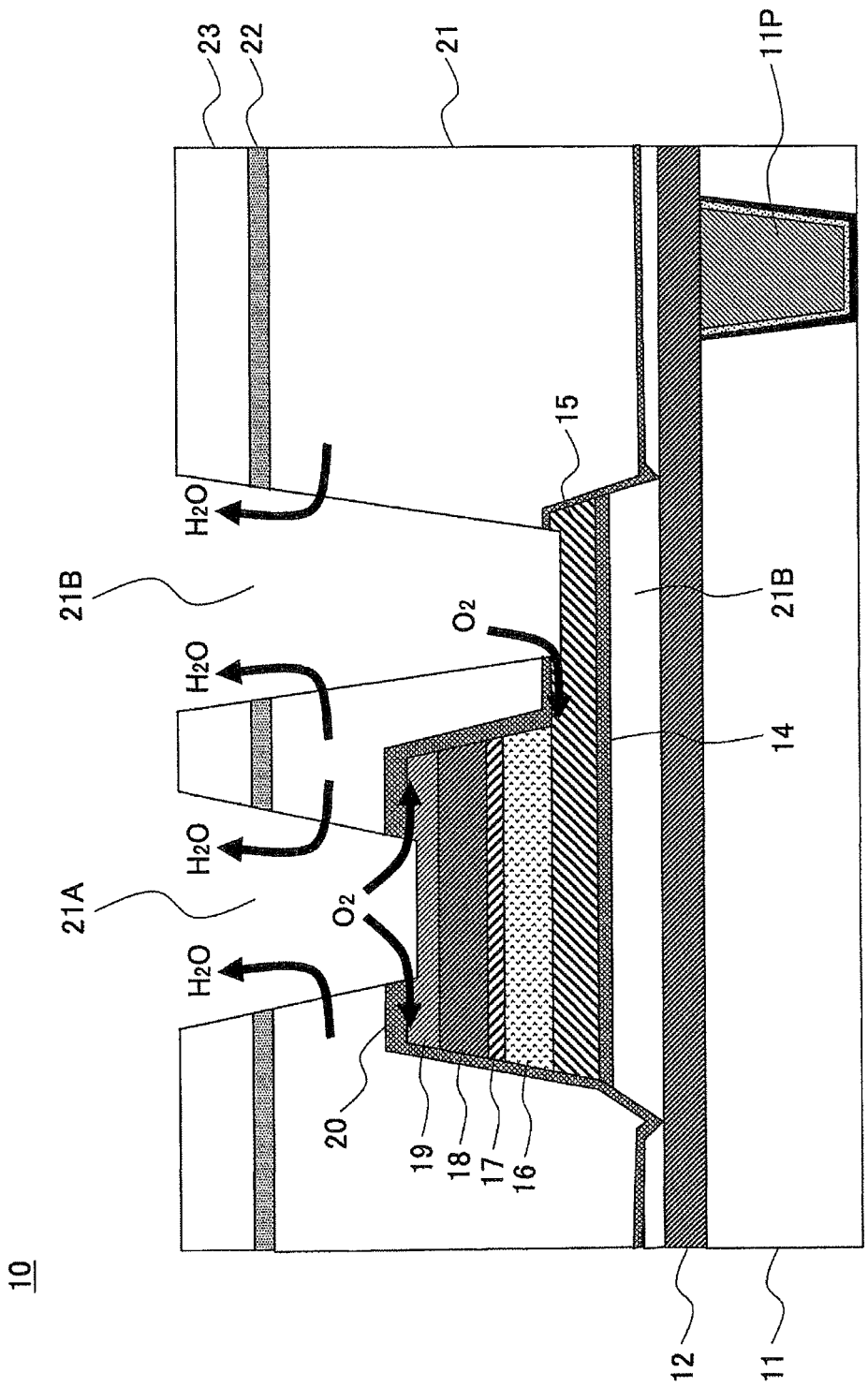
FIGS. 1 and 2 are diagrams showing the process of fabricating a semiconductor device according to a related art.
Figure 2:
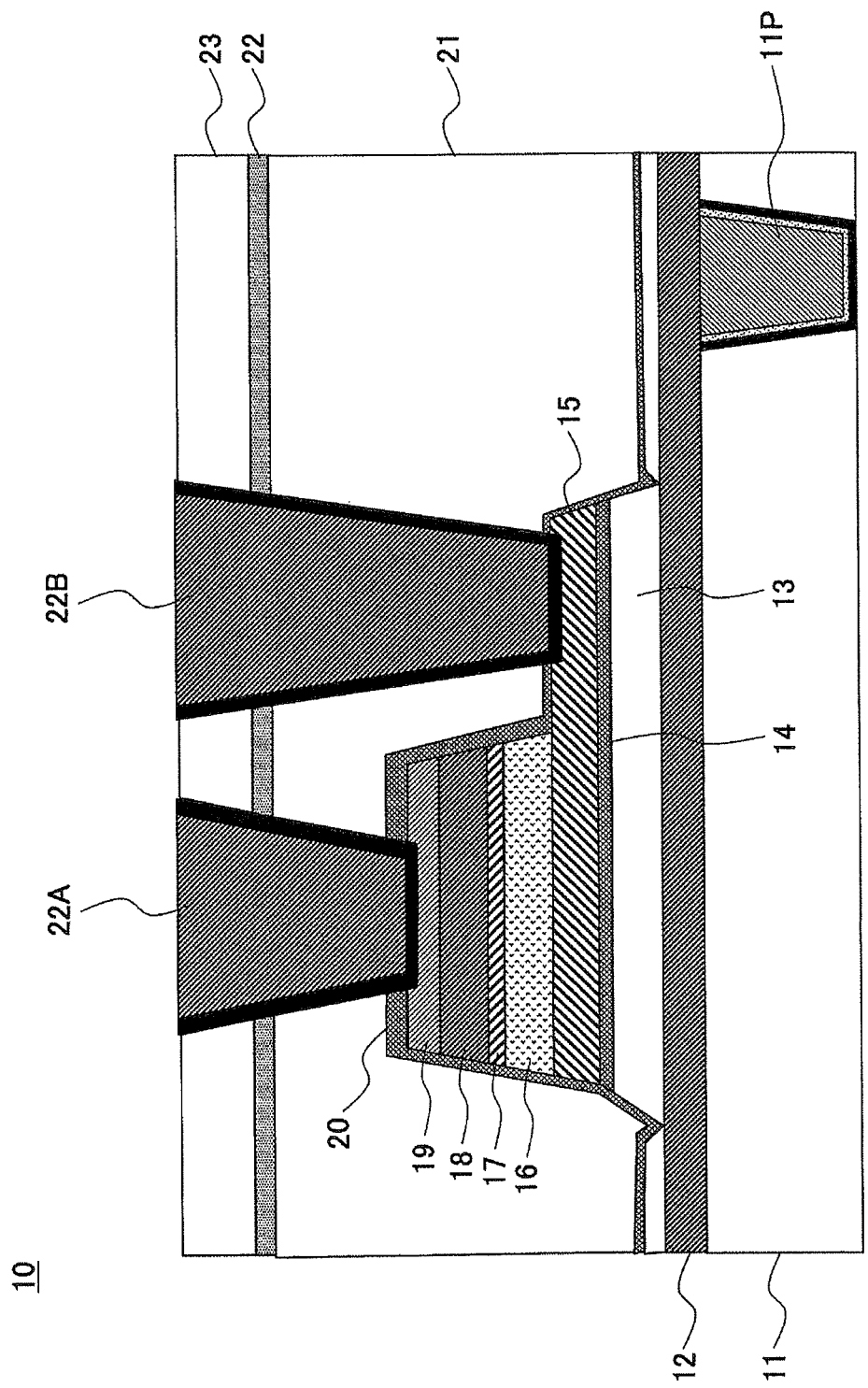

FIGS. 1 and 2 show the fabrication process of a ferroelectric memory 10 according to a related art. Here, it should be noted that FIG. 1 shows only a part of the ferroelectric memory 10 in the vicinity of the ferroelectric capacitor.

Referring to FIG. 1, there is formed an oxidation resistance film 12 of SiON on the surface of the interlayer insulation film 11, in which a via-plug 11P is formed, and there is formed a ferroelectric capacitor C on the SiON film 12 via an interlayer insulation film 13 and further an $Al_2O_3$ hydrogen barrier film 14, such that the ferroelectric capacitor C is formed as a result of consecutive stacking of a lower electrode 15, a ferroelectric film 16, a lower layer part 17 of an upper electrode formed of $IrO_2$ (IrOx), an upper layer part 18 of the upper electrode also formed of $IrO_2$ (IrOx), and a cap layer 19 of Pt capping the upper electrode. Further, there is formed a conductive plug 11P in the interlayer insulation film 11 in contact with a transistor, or the like, provided in an underlying layer.

Further, the ferroelectric capacitor C is covered with another hydrogen barrier film 20 of $Al_2O_3$ and is embedded in an interlayer insulation film formed by a plasma CVD process. Further, there is formed another hydrogen barrier film 22 of $Al_2O_3$ on the interlayer insulation film 21, and a further interlayer insulation film 23 is formed on the hydrogen barrier film 22.

Further, in the state of FIG. 1, there is formed a contact hole 21A and a contact hole 21B in the interlayer insulation film 21 so as to extend through the interlayer insulation film 23, the hydrogen barrier film 22 and further the hydrogen barrier film 20 such that the contact hole 21A exposes the cap layer 19 covering the upper electrode of the ferroelectric capacitor C and such that the contact hole 21B exposes the lower electrode 15 of the ferroelectric capacitor.

According to the foregoing ferroelectric memory of the related art, the contact holes 21A and 21B are filled with respective contact plugs as shown in FIG. 2 for enabling electric connection to the ferroelectric capacitor C. There, before proceeding to the step of FIG. 2, a thermal annealing process is conducted in oxygen ambient in the state of FIG. 1 for removing water or hydrogen in the interlayer insulation films 21 and 23 and for compensating oxygen defects in the ferroelectric film 16. It should be noted that the interlayer insulation films 13, 21 and 23 are formed of so-called plasma TEOS film by using plasma CVD process and it is inevitable that such interlayer insulation films contain water or hydrogen. Such water or hydrogen tends to cause accumulation in the interlayer insulation film 21, which is covered with the hydrogen barrier film 22 at the top surface thereof. There, there tends to be caused problems such as reduction of the ferroelectric film 16 in the ferroelectric capacitor C during the process of forming multilayer interconnection structure, which is to be conducted later.

In the state of FIG. 1, the contact holes 21A and 21B provide an escape path of water or hydrogen during such dehydration processing or hydrogen removal processing and further provide the path for introducing oxygen at the time of the thermal annealing process conducted in the oxygen ambient.

Thus, it is preferable to provide such escape paths of water or hydrogen as many as possible in order to attain effective dehydration and hydrogen removal. On the other hand, the contact hole 21A exposing the cap layer 19 of the upper electrode at the top part of the ferroelectric capacitor has a small aspect ratio, and thus, the area of the interlayer insulation film 21 exposed at the sidewall surface of the contact hole 21A is small. Thereby, the effect of degassing is rather limited with the contact hole 21A.

In order to attain effective degassing, it is preferable to form contact holes of large depth and hence large aspect ratio in the interlayer insulation film 21 with large number, while such a construction necessitates increase of area of the lower electrode of the ferroelectric capacitor in correspondence to the increased number of contact holes. Thereby, there arises a problem of increase of cell area.

FIRST EMBODIMENT

FIGS. 3-6 show the fabrication process of a semiconductor device having a ferroelectric capacitor according to a first embodiment.

Figure 3:
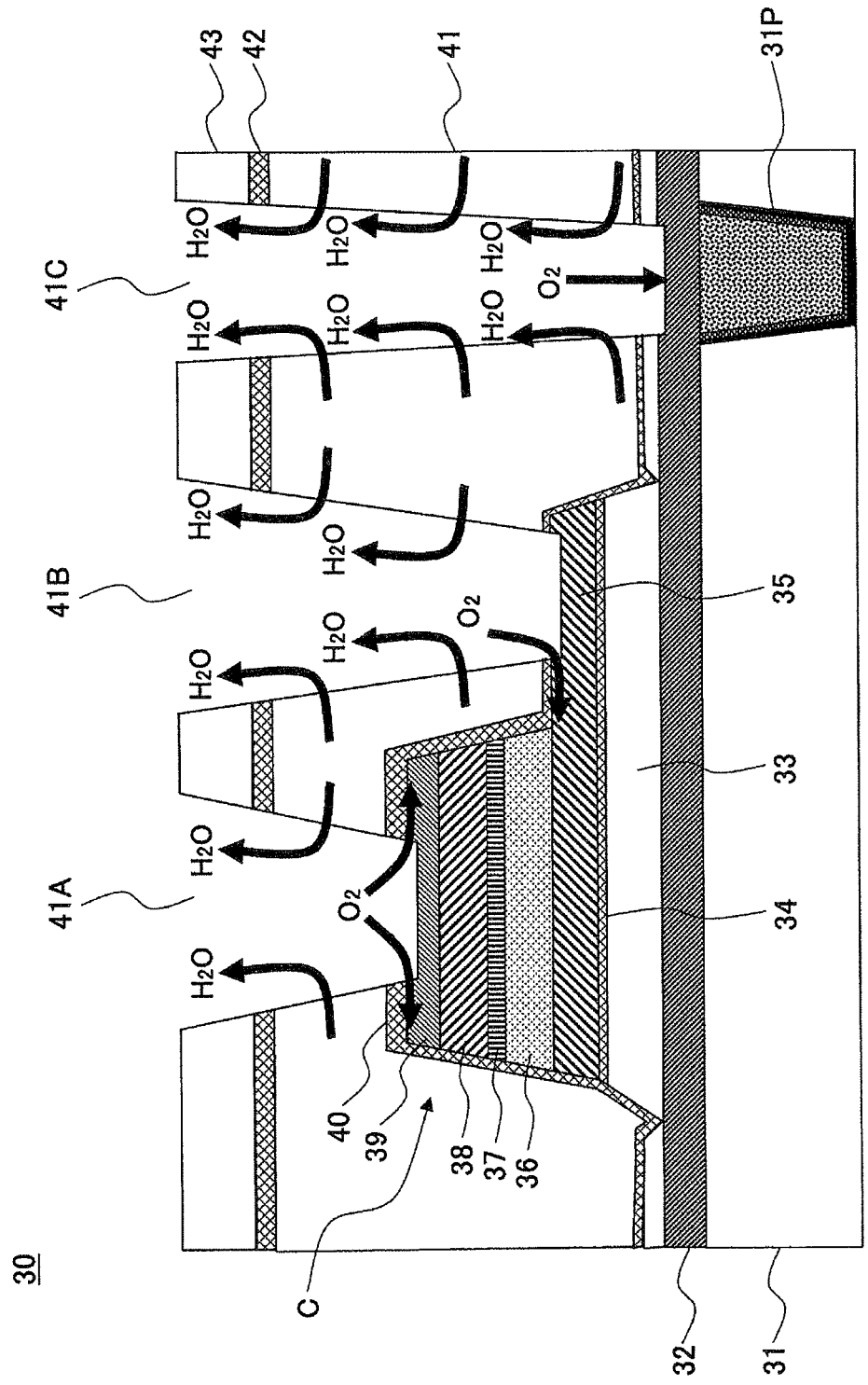
FIGS. 3-5 are diagrams showing the process of fabricating a semiconductor device according to a first embodiment.

Referring to FIG. 3, there is formed an SiON anti-oxidation film 32 on the surface of an interlayer insulation film 31, in which a via-plug 31P is formed, with a thickness of 100 nm, and an interlayer insulation film 22 of a plasma TEOS film is formed on the SiON film 32 with a thickness of about 130 nm. While not illustrated, there is provided a silicon substrate carrying an active element such as a MOS transistor underneath the interlayer insulation film 31, and the via-plug 31P is formed in contact with a diffusion region of such a MOS transistor.

On the interlayer insulation film 33, there is formed an $Al_2O_3$ film 34 with a thickness of 20 nm for improvement of the crystal quality, and there is formed a ferroelectric capacitor C on the $Al_2O_3$ film 34 by consecutively stacking a lower electrode 35 of Pt having a thickness of 150 nm, a ferroelectric film 36 of PZT having a thickness of 150 nm, a lower layer part 37 of an upper electrode formed of $IrO_2$ (IrOx) having an oxygen-rich composition and a thickness of 50 nm, an upper layer part 38 of the upper electrode formed of $IrO_2$ (IrOx) having a composition more like a metal and a thickness of 200 nm, and a cap layer 39 of the upper electrode formed of Pt having a thickness of 100 nm.

Further, the ferroelectric capacitor C is covered with a hydrogen barrier film 40 of $Al_2O_3$ having a thickness of 70 nm and is embedded in an interlayer insulation film 41 of plasma TEOS film having a thickness of 1270 nm. Further, on the planarized surface of the interlayer insulation film 41, there is formed another hydrogen barrier film 42 of $Al_2O_3$ with a thickness of 50 nm, and a further interlayer insulation film 42 of plasma TEOS film is formed on the hydrogen barrier film 42 with a thickness of 200 nm.

Further, in the state of FIG. 3, there is formed a contact hole 41A and a contact hole 41B in the interlayer insulation film 41 so as to extend through the interlayer insulation film 43, the hydrogen barrier film 42 and further the hydrogen barrier film 40 such that the contact hole 41A exposes the cap layer 39 covering the upper electrode of the ferroelectric capacitor C and such that the contact hole 41B exposes the lower electrode 35 of the ferroelectric capacitor. The contact hole 41A has a depth of 400 nm when measured from the foregoing $Al_2O_3$ film 42.

With the present embodiment, there is further formed a deep opening 41C in the interlayer insulation film 41 in correspondence to the via-plug 31P so as to expose the SiON film 32. In the illustrated example, the contact hole 41A has a depth of 1270 nm when measured from the foregoing $Al_2O_3$ film 42. The opening 41C has an aspect ratio larger than any of the contact holes 41A and 41B.

In the present embodiment, the structure of FIG. 3 is annealed for 60 minutes at the temperature of 500-600° C. With this, oxygen defect compensation is attained for the PZT film 36. During such thermal annealing process for recovery, oxygen in the ambient penetrates through the contact holes 41A and 41B and the oxygen defect compensation is achieved for the PZT film 36 in the ferroelectric capacitor C.

At the same time, water or hydrogen in the interlayer insulation film 41 is released to the outside via the contact holes 41A and 41B. Thereby, because the present embodiment is formed with foregoing the additional opening 41C in such a manner that the opening 41C continues from the top end to the bottom end of the interlayer insulation film 41, a large area is secured for the sidewall surface and the efficiency of dehydration and hydrogen removal is improved significantly.

During the thermal annealing process of FIG. 3, the oxygen in the ambient penetrates through the opening 41C. Because the SiON anti-oxidation film 32 is formed at the bottom part of the opening 41C, there occurs no oxidation of the conductive plug 31P underneath of SiON anti-oxidation film 32 even when such penetration of oxygen takes place. Further, at the bottom of the contact holes 41A and 41B, there are exposed respectively the oxidation resistant Pt electrodes 39 and 35, and thus, there is caused no oxidation in these electrodes as a result of the foregoing oxidation processing.

It should be noted that the thermal annealing process of FIG. 3 can be achieved in the ambient containing oxygen or ozone with 1% or more. Further, while the thermal annealing process is conducted in the atmospheric pressure in the illustrated example, it is possible to improve the efficiency of dehydration and hydrogen removal further when the thermal annealing process is conducted in a reduced pressure environment.

Further, it is possible to carry out the thermal annealing process of FIG. 3 first in the ambient free from oxygen and subsequently in the ambient containing oxygen or ozone with 1% or more.

Further, it is possible to nitride the surfaces of the contact holes 41A, 41B and the opening 41C immediately after the process of FIG. 3 by carrying out a plasma processing while using an $N_2O$ gas, for example. As a result of such nitridation processing, it is possible to suppress re-adsorption of water or hydrogen to the surfaces.

Figure 4:
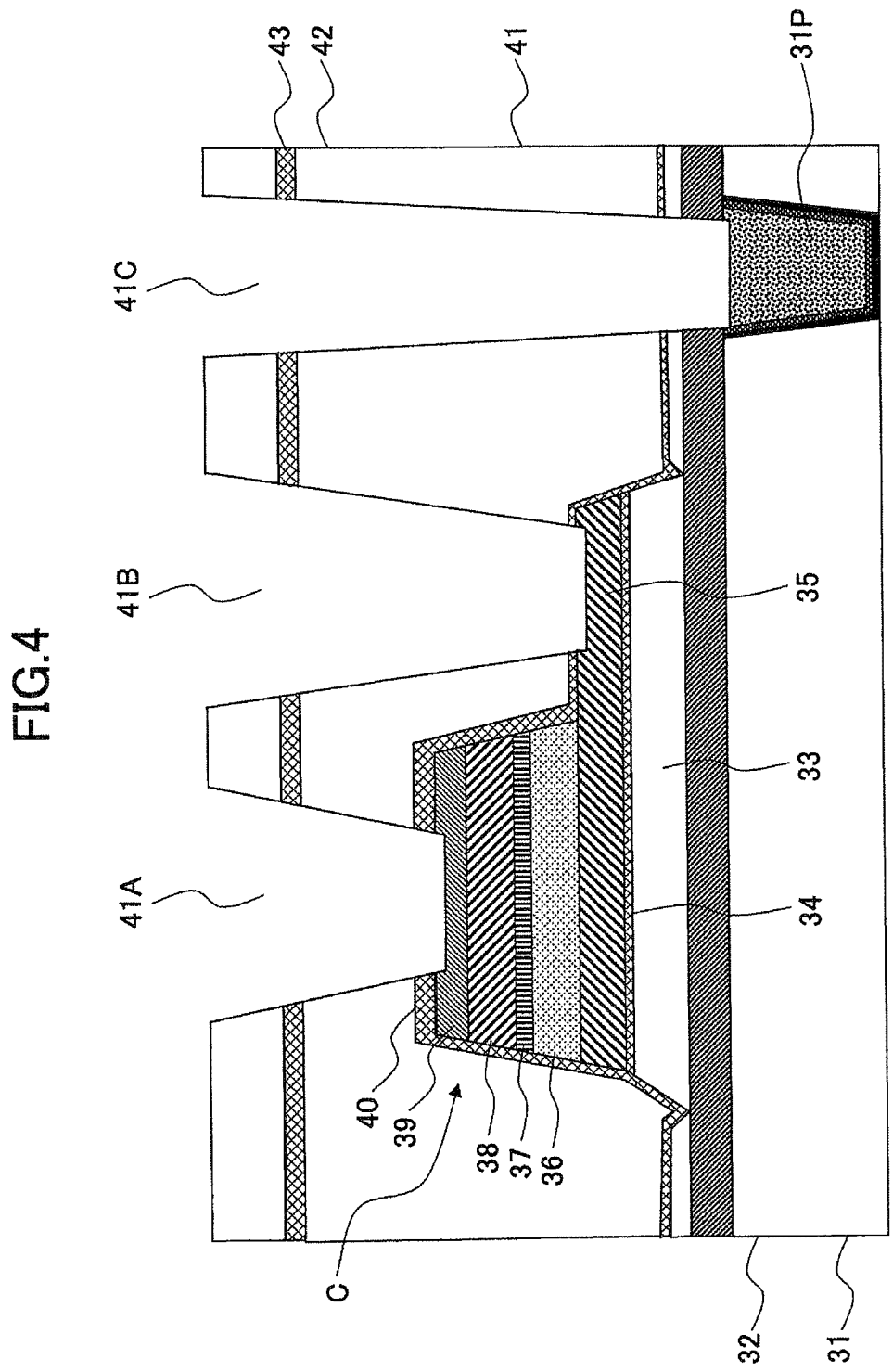

Next, after the step of FIG. 3, an etch-back process is conducted in the step of FIG. 4 and the conductive plug 31P is exposed at the bottom of the opening 41C.

Further, in the step of FIG. 5, the contact holes 41A and 41B and the opening 41C are covered with a sputtered TiN film and subsequently filled with a W film. Further, by applying a CMP process to the W film, the W via-plugs 42A, 42B and 42C are formed respectively in the contact holes 41A, 41B and 41C as shown in FIG. 5, respectively via the TiN barrier metal films 42a, 42b and 42c.

Figure 5:
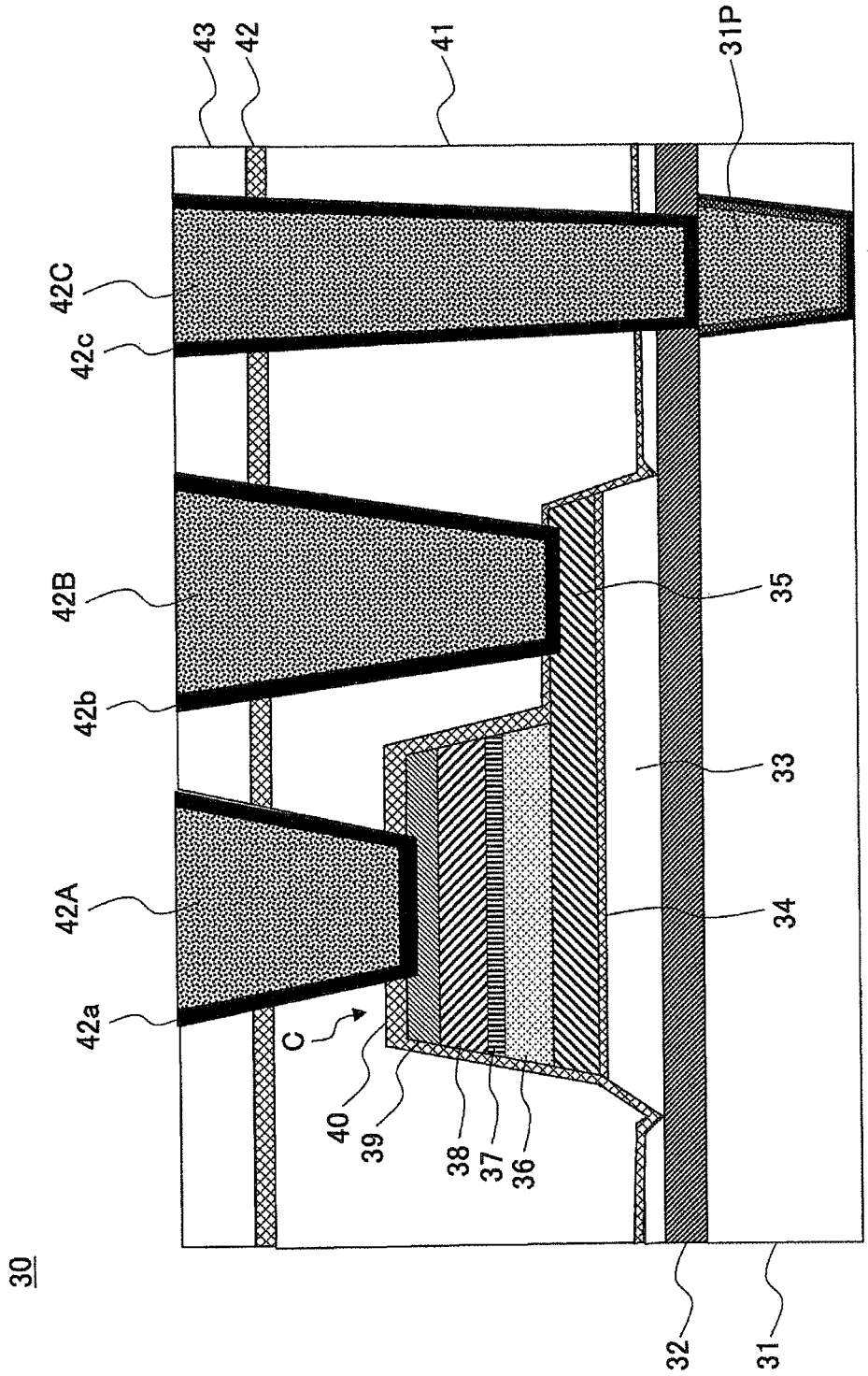

According to such a construction, it becomes possible to effectively dehydrate and remove hydrogen from the interlayer insulation film 41 covering the ferroelectric capacitor C, and it becomes possible to avoid the problem of deterioration of the characteristics of the ferroelectric capacitor C by the water or hydrogen in the interlayer insulation film 41 even when a process for forming the multilayer interconnection structure is conducted further on the structure of FIG. 5.

FIG. 6A is a diagram showing the memory cell region of a ferroelectric memory in which the ferroelectric capacitors C of FIG. 4 are provided in the form of array, while FIGS. 6B and 6C are photographs respectively showing the cross-section taken along a line A-A' and B-B' shown in FIG. 6A.

Referring to FIG. 6A, it can be seen that the lower electrodes 35 and the PZT films 36 are formed in the memory cell region repeatedly, each in the form of a pattern extending in the longitudinal direction, and there is formed an array of the ferroelectric capacitors C by providing the upper electrodes 38 upon the respective PZT patterns 36.

Further, in each of the ferroelectric capacitors C, the via-plug 42A and the via-plug 42C are connected with each other by an interconnection pattern formed on the interlayer insulation film 43 as shown in FIGS. 6B and 6C. Further, the plan view of FIG. 6A represent the bit line contacts 42E formed in the memory cell region.

Figure 6:
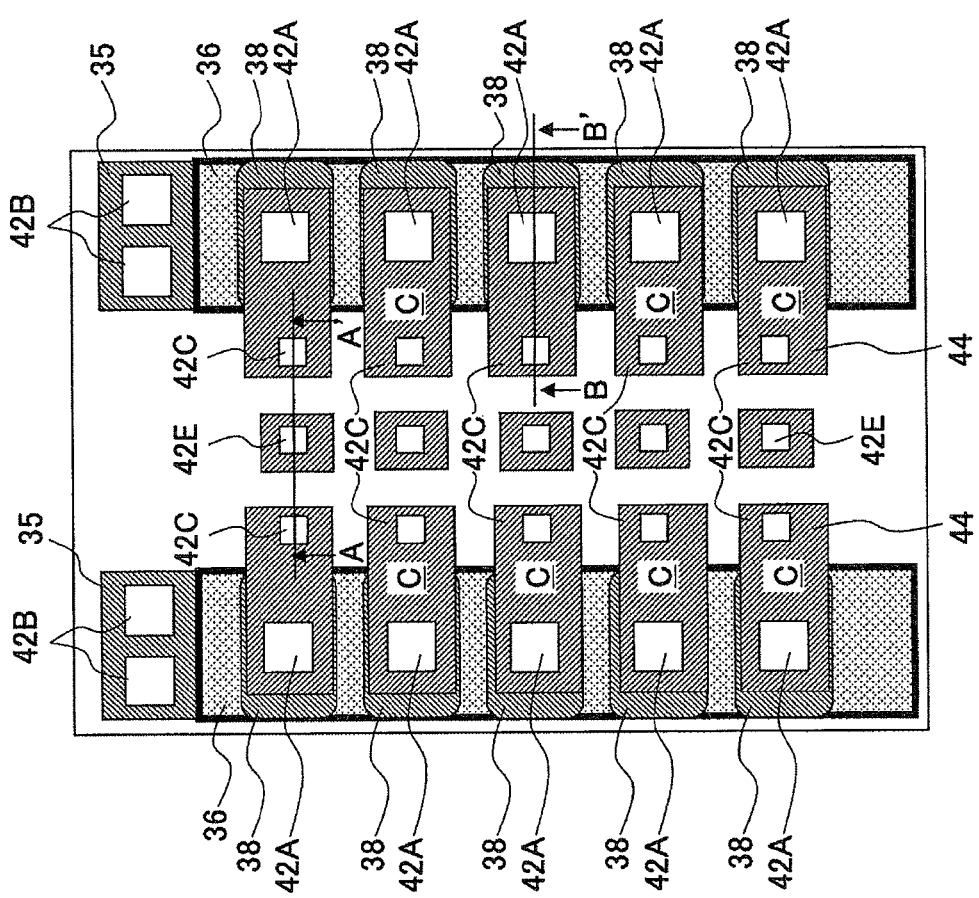
FIGS. 6A-6C are diagrams showing the memory cell array of a ferroelectric memory device according to the first embodiment.
Figure 7:
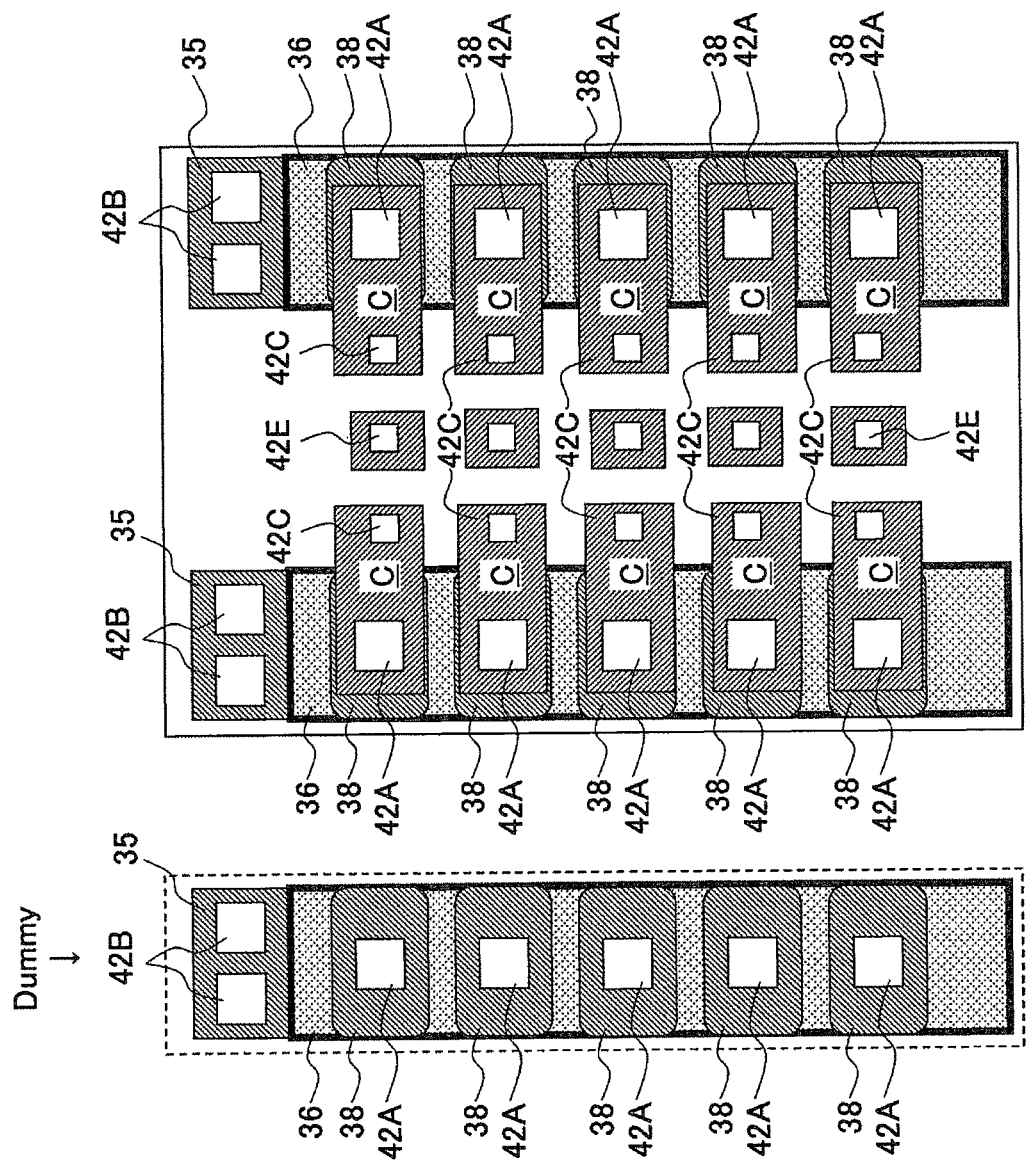
FIG. 7 is a diagram showing the construction of a ferroelectric memory device according to a comparative example.

Now, when it attempt is made to carry out the hydration processing and the hydrogen removal processing of the interlayer insulation film 21 thoroughly in the structure of FIG. 2, which is fabricated according to the process of FIG. 1, without increasing the area of the lower electrode, it will be come necessary to provide separate dummy capacitors as shown in FIG. 7, while such dummy capacitors occupy the area more or less equal to the area of the normal capacitors, and thus, there arises a problem of decrease of integration density of the ferroelectric memory when such dummy capacitors are provided with large number. In FIG. 7, it should be noted that, for the purpose of comparison, the reference numerals used in FIG. 6 are used intentionally, in spite of the fact that it is proper to use the reference numerals of FIGS. 1 and 2.

SECOND EMBODIMENT

Figure 8:
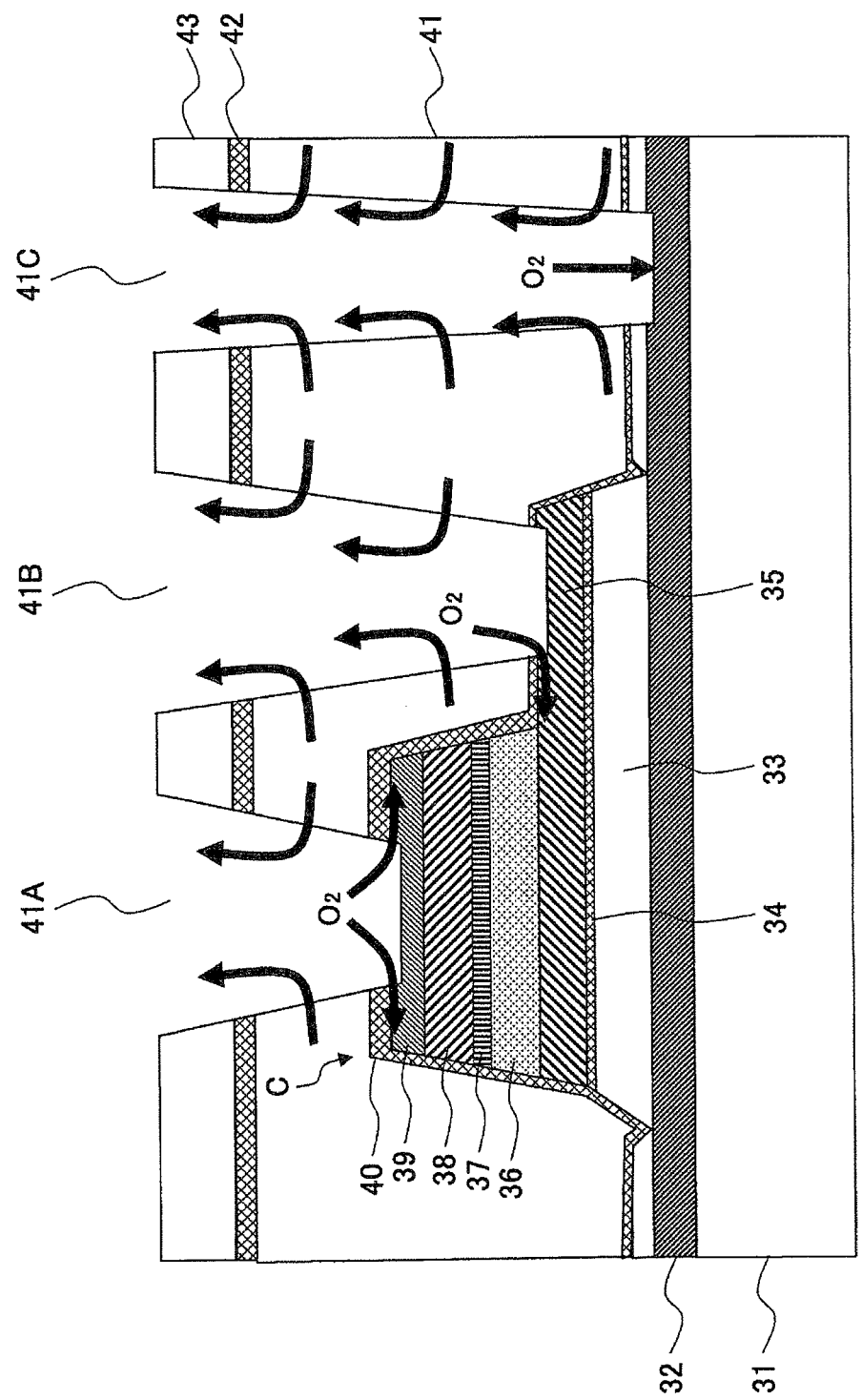
FIGS. 8 and 9 are diagrams showing the process of fabricating a semiconductor device according to a second embodiment.
Figure 9:
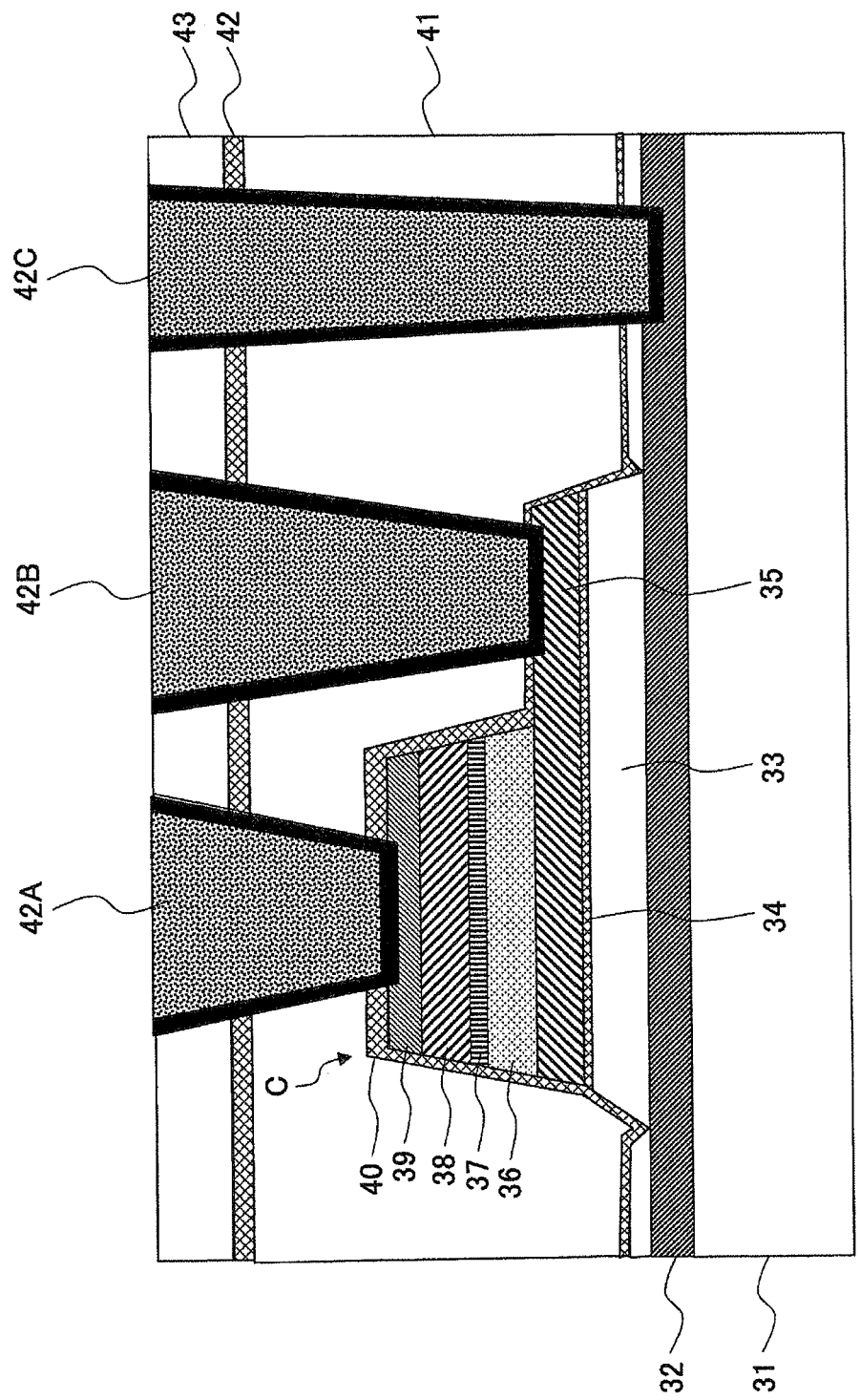

FIGS. 8 and 9 show the fabrication process of a semiconductor device having the ferroelectric capacitor according to a second embodiment. In the drawings, those parts explained before are designated by the same reference numerals and the description thereof will be omitted.

Referring to FIG. 8, the opening 41C in the interlayer insulation film 31 does not correspond to the conductive plug 31P in the interlayer insulation film 31C, and thus, there exists no conductive plug right underneath the opening 41C.

Thus, with the present embodiment, the via-plugs 42A, 42B and 42C are formed at the time of the process of via-plug formation shown in FIG. 9 without etching the SION film 32 at the bottom part of the opening 41C. Thereby, the via-plug 42C becomes a dummy via-plug.

Even in such a case, it should be noted that the thermal annealing process in the oxidizing ambient is conducted in the state the contact holes 41A, 41B and 41C are formed, and thus, it is possible to achieve effective dehydration and hydrogen removal for the interlayer insulation film 41.

THIRD EMBODIMENT

Figure 10:
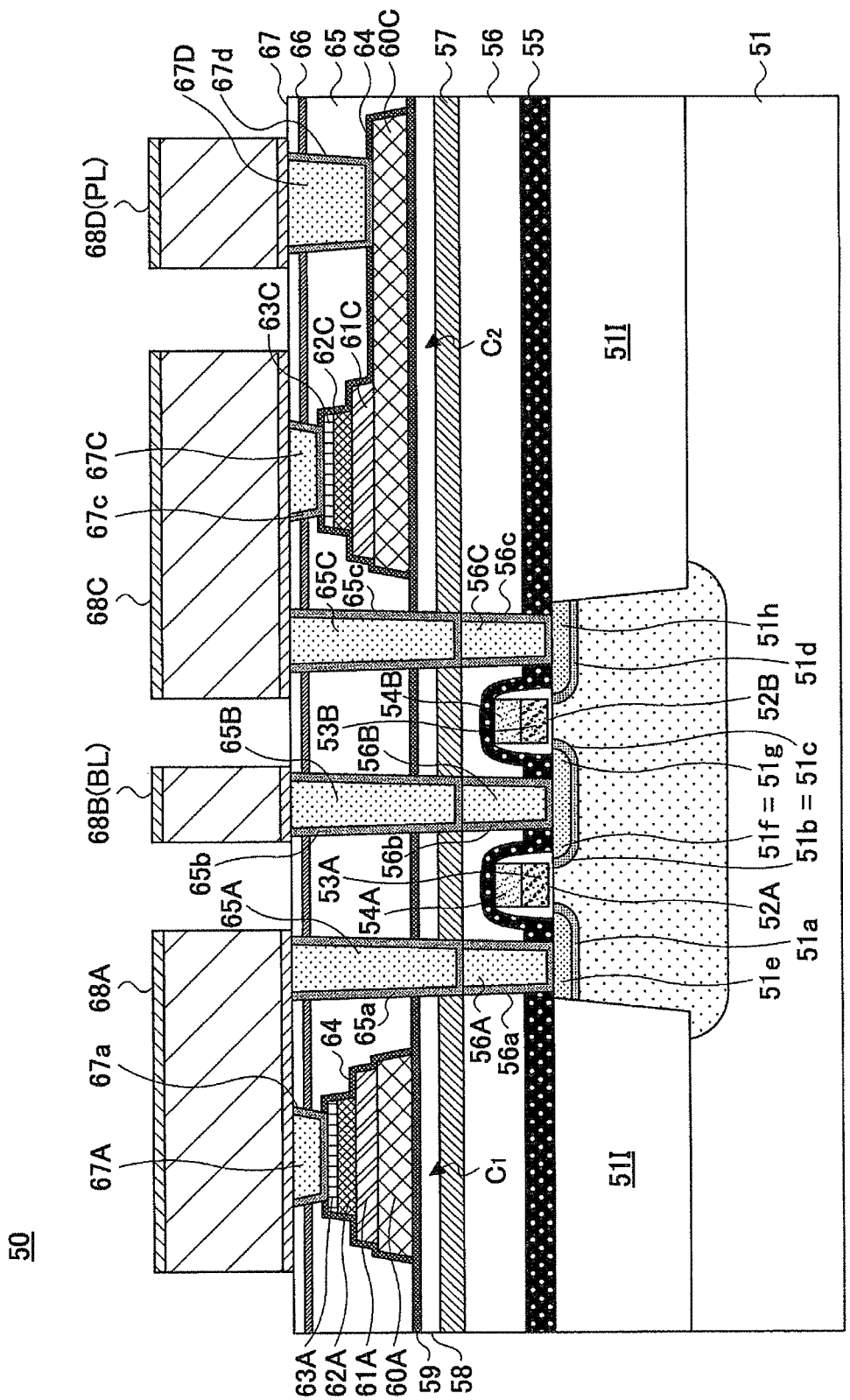
FIG. 10 is a diagram showing the construction of a ferroelectric memory device according to a third embodiment.

FIG. 10 is a diagram showing the construction of a ferroelectric memory device 50 according to a third embodiment.

Referring to FIG. 10, the ferroelectric memory device 50 is a so-called 1T1C device and includes two memory cell transistors formed in a device region 51A defined on a silicon substrate 51 by a device isolation region 51I such that the two memory cell transistors share a bit line.

More specifically, there is formed an n-type well in the silicon substrate 51 as the device region 51A, wherein there are formed a first MOS transistor having a polysilicon gate electrode 53A and a second MOS transistor having a polysilicon gate electrode 53B on the device region 51A respectively via a gate insulation film 52A and a gate insulation film 52B.

In the silicon substrate 51, there are formed LDD regions 51a and 51b of p⁻-type in correspondence to respective sidewalls of the gate electrode 53A, and there are further formed LDD regions 51c and 51d of p⁻-type in correspondence to respective sidewalls of the gate electrode 53B. Here it should be noted that because the first and second MOS transistors are formed in the device region 51A commonly, the same p⁻-type diffusion region is used as the LDD region 51b and the LDD region 51c.

On the polysilicon gate electrodes 53A and 53B, there are formed silicide layers 54A and 54B, respectively, and there are further formed sidewall insulation films on the sidewall surfaces of the polysilicon gate electrode 53A and on the sidewall surfaces of the polysilicon gate electrode 53B, respectively.

Further, diffusion regions 51e and 51f of p⁺-type are formed in the silicon substrate 51 at respective outer sides of the sidewall insulation films of the gate electrode 53A, and diffusion regions 51g and 51h of p⁺-type are formed in the silicon substrate 51 at respective outer sides of the sidewall insulation films of the gate electrode 53B. Thereby, the same p⁺-type diffusion region is used commonly for the diffusion regions 51f and 51g.

Further, on the silicon substrate 51, there is formed an SION film 55 with a thickness of 100 nm as an anti-oxidation film so as to cover the gate electrode 53A including the silicide layer 54A and the sidewall insulation films of the gate electrode 53A and so as to cover the gate electrode 53B including the silicide layer 54B and the sidewall insulation films on the gate electrode 53B, and an interlayer insulation film 56 is formed on the SiON film 55. The interlayer insulation film 56 may be formed by forming an $SiO_2$ film of the thickness of 20 nm by a plasma CVD process, followed by an SiN film of the thickness of 80 nm thereon, and further forming a TEOS film of the thickness of 1000 nm further thereon by a plasma CVD process, followed by a polishing process conducted by a CMP (chemical mechanical polishing process) such that the total film thickness becomes 700 nm.

Further, in the interlayer insulation film 56, there are formed contact holes so as to expose the diffusion regions 51e, 51f (thus the diffusion region 51g), and the diffusion region 51h, and via-plugs 56A, 56B and 56C of W (tungsten) are formed in the respective contact holes with a diameter of 0.25 µm via respective adhesion layers 56a, 56b and 56c, each formed of lamination of a Ti film of the thickness of 30 nm and a TiN film of the thickness of 20 nm, by a CVD process and subsequent CMP process.

The interlayer insulation film 56 is covered with an anti-oxidation film of SiON of the thickness of 130 nm, and there are formed, on the SiON film 57, a ferroelectric capacitor C1 and a ferroelectric capacitor C2 via a plasma interlayer insulation film 58 of the thickness of 130 and an $Al_2O_3$ film 59, which is provided for improving the crystal quality, wherein the ferroelectric capacitor C1 is formed by stacking a lower electrode 60A of Pt of the thickness of 150 nm, a ferroelectric film 61A of PZT of the thickness of 150 nm, an upper electrode 62A of IrOx (IrOx) of the thickness of 250 nm, and a cap layer 63A of the upper electrode formed of Pt with the thickness of 50 nm, and such that the ferroelectric capacitor C2 is formed similarly by stacking a lower electrode 60C, a ferroelectric film 61C, an upper electrode 62C and a cap layer 63C of the upper electrode.

The ferroelectric capacitors C1 and C2 are covered with a hydrogen barrier film 64 of $Al_2O_3$ and are embedded in an interlayer insulation film 65 of the thickness of 1500 nm formed by a plasma CVD process, wherein the thickness of the interlayer insulation film 65 is reduced to 1000 nm by a CMP process.

The interlayer insulation film 65 thus formed has a planarized surface as a result of the CMP process, wherein the interlayer insulation film 65 is covered further with another hydrogen barrier film 66 of $Al_2O_3$ of the thickness of 50 nm, and interconnection patterns 68A, 68B, 68C and 68D of Al, or the like, are formed over the hydrogen barrier film 66 via another interlayer insulation film 67 of a plasma TEOS film, or the like, of the thickness of 300 nm, together with a barrier film of the Ti/TiN structure.

Now, with the construction of FIG. 10, there is formed a contact hole in the interlayer insulation film 65 at the part right underneath the Al interconnection pattern 68A through the interlayer insulation film 67 and the Al2O3 hydrogen barrier film 66 so as to expose the cap layer 63A of the upper electrode of the ferroelectric capacitor C1, wherein it should be noted that the contact hole is filled with a conductive plug 67A of Al, W, or the like, via a barrier metal film 67a.

Similarly, there is formed a contact hole in the interlayer insulation film 65 at the part right underneath the Al interconnection pattern 68C through the interlayer insulation film 67 and the $Al_2O_3$ hydrogen barrier film 66 so as to expose the cap layer 63C of the upper electrode of the ferroelectric capacitor C2, wherein it should be noted that the contact hole is filled with a conductive plug 67C of Al, W, or the like, via a barrier metal film 67c.

Further, in the part of the interlayer insulation film 65 right underneath the Al interconnection pattern 68D, there is formed a contact hole exposing the lower electrode 64 of the ferroelectric capacitor C2 and the contact hole is filled with a conductive plug 67D or Al or W via a barrier metal film 67d. While not illustrated, a similar conductive plug is formed also for the lower electrode 60A of the ferroelectric capacitor C1.

Further, in the interlayer insulation film 65, there are formed contact holes in the interlayer insulation film 65 at the part right underneath the interconnection pattern 65B through the interlayer insulation film 67, the $Al_2O_3$ hydrogen barrier film 66, the $Al_2O_3$ film 59 and further through the interlayer insulation film 58 so as to expose the via-plug 56B, wherein the contact hole is filled with a conductive plug 65B via a barrier metal film 65b. Here, the interconnection pattern 68B constitutes the bit line (BL) of the ferroelectric memory while the interconnection pattern 68D constitutes a plate line (PL).

Next, the fabrication process of the ferroelectric memory device 50 of FIG. 10 will be explained with reference to FIGS. 11A-11H.

Referring to FIG. 11, there are formed a first MOS transistor having the gate electrode 53A and a second MOS transistor having the gate electrode 53B on the silicon substrate 51, wherein the first and second MOS transistors are covered with the interlayer insulation film 56 via the SiON film 55. As explained before, the interlayer insulation film 56 is formed by stacking a plasma $SiO_2$ film of the thickness of 20 nm, the SiN film of the thickness of 80 nm and the plasma TEOS film of the thickness of 1000 nm, wherein the uppermost plasma TEOS film is processed by a CMP process such that the total thickness of the interlayer insulation film as a hole becomes 700 nm.

Figure 11A:
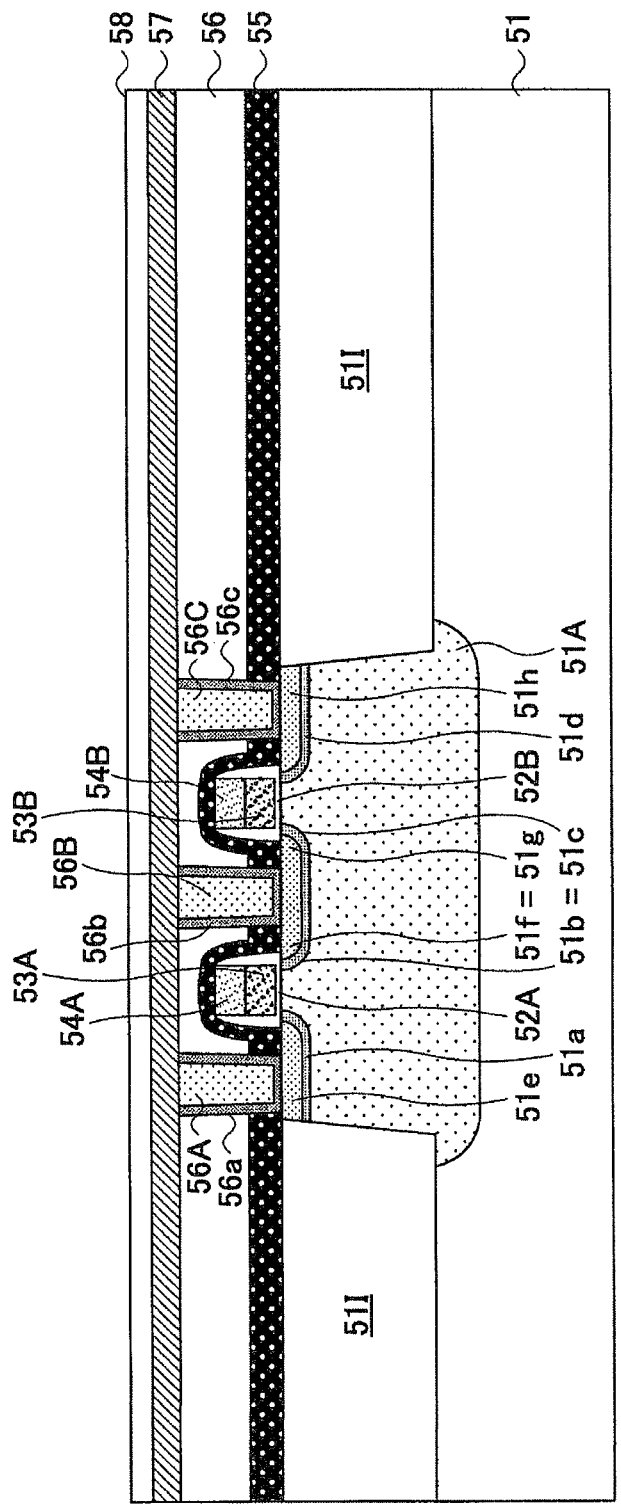

Further, in the state of FIG. 11A, it can be seen that the conductive plugs 56A, 56B, 56C and 56D are formed in the interlayer insulation film 56 respectively in contact with the diffusion regions 51e, 51f, 51g and 51h constituting the source and drain regions of the first and second MOS transistors respectively via the barrier metal films 56e, 56f, 56g and 56h, wherein there is formed an interlayer insulation film 58 formed on an SION anti-oxidation film 57 of the thickness of 130 nm and the plasma TEOS film of the thickness of 130 nm on the interlayer insulation film 56 so as to cover the conductive plugs 56A-56C.

Next, in the step of FIG. 11B, the $Al_2O_3$ film 59 is formed on the interlayer insulation film 58, and there are deposited a Pt film 60 of the thickness of 150 nm, a PZT film 61 of the thickness of 150 nm, an $IrO_2$ (IrOx) film 62 of the thickness of 250 nm and a Pt film 63 of the thickness of 50 nm consecutively on the $Al_2O_3$ film 59. With this, there is formed a laminated structure corresponding to the ferroelectric capacitors C1 and C2.

Next, in the step of FIG. 11C, the films 60-63 are subjected to a patterning process, and with this the ferroelectric capacitors C1 and C2 are formed such that the ferroelectric capacitor C1 is formed of stacking of the Pt film 60A, the PZT film 61A, the $IrO_2$ (IrOx) film 62A and the Pt film 63A, and such that the ferroelectric capacitor C2 is formed of stacking of the Pt film 60C, the PZT film 61C, the $IrO_2$ (IrOx) film 62C and the Pt film 63C. Further, in the step of FIG. 11C, the $Al_2O_3$ film 64 is formed as a hydrogen barrier film so as to cover the ferroelectric capacitors C1 and C2.

Figure 11D:
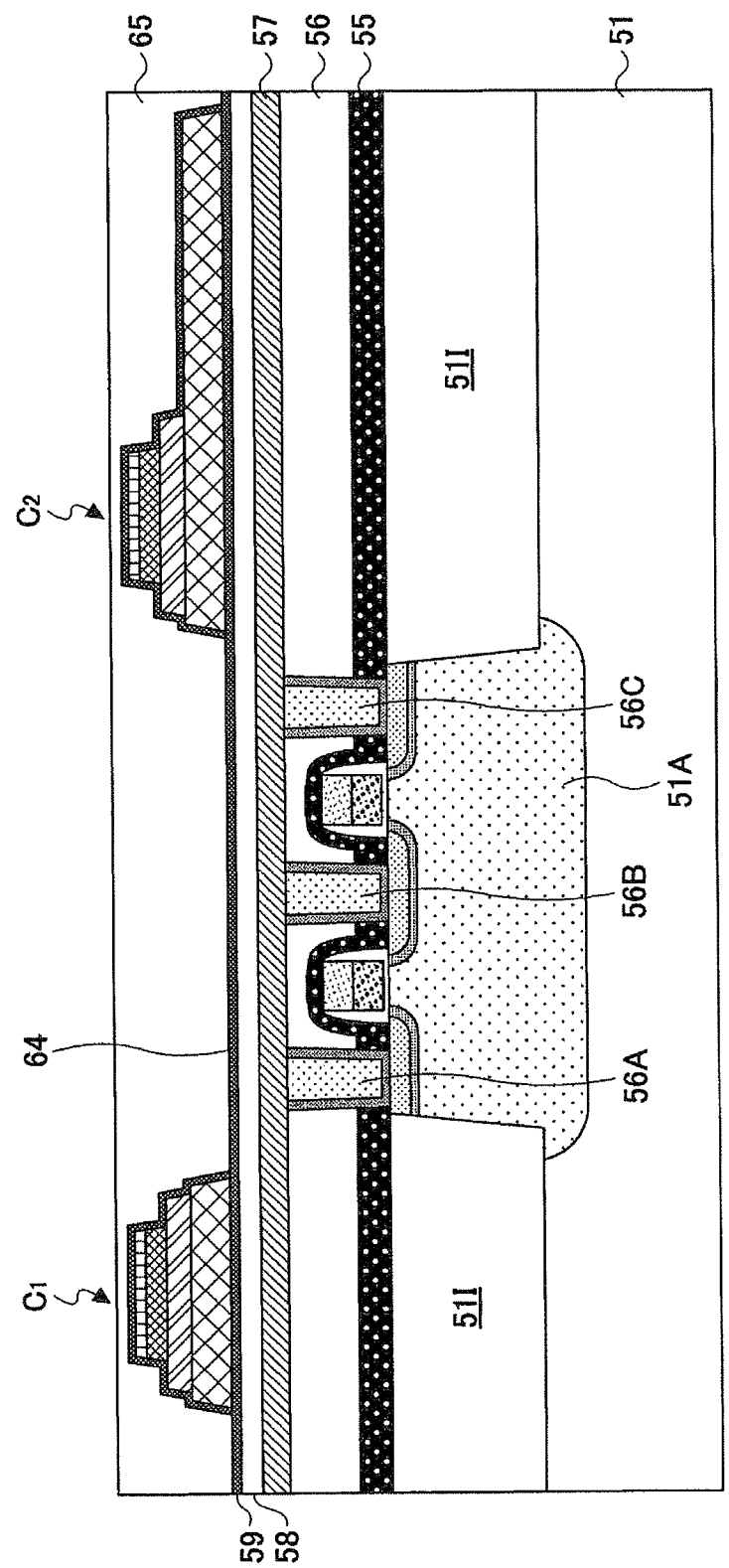

Next, in the step of FIG. 11D, the plasma TEOS film 65 is deposited on the structure of FIG. 11C with the thickness of 1500 nm so as to cover the ferroelectric capacitors C1 and C2, followed by a polishing process by CMP such that the film thickness is reduced to 1000 nm. With this, the surface of the plasma TEOS film 65 is planarized.

Figure 11E:
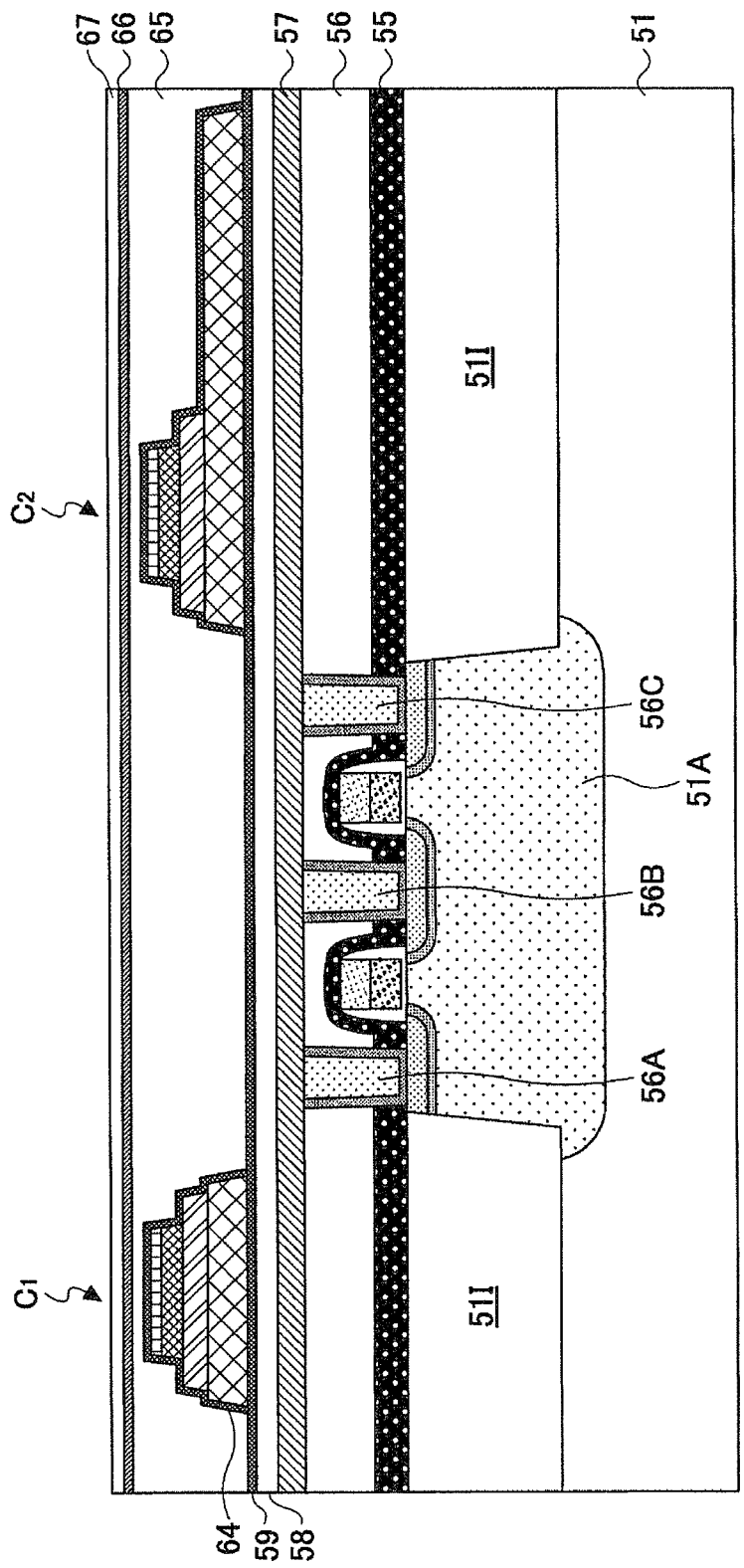
Figure 11F:
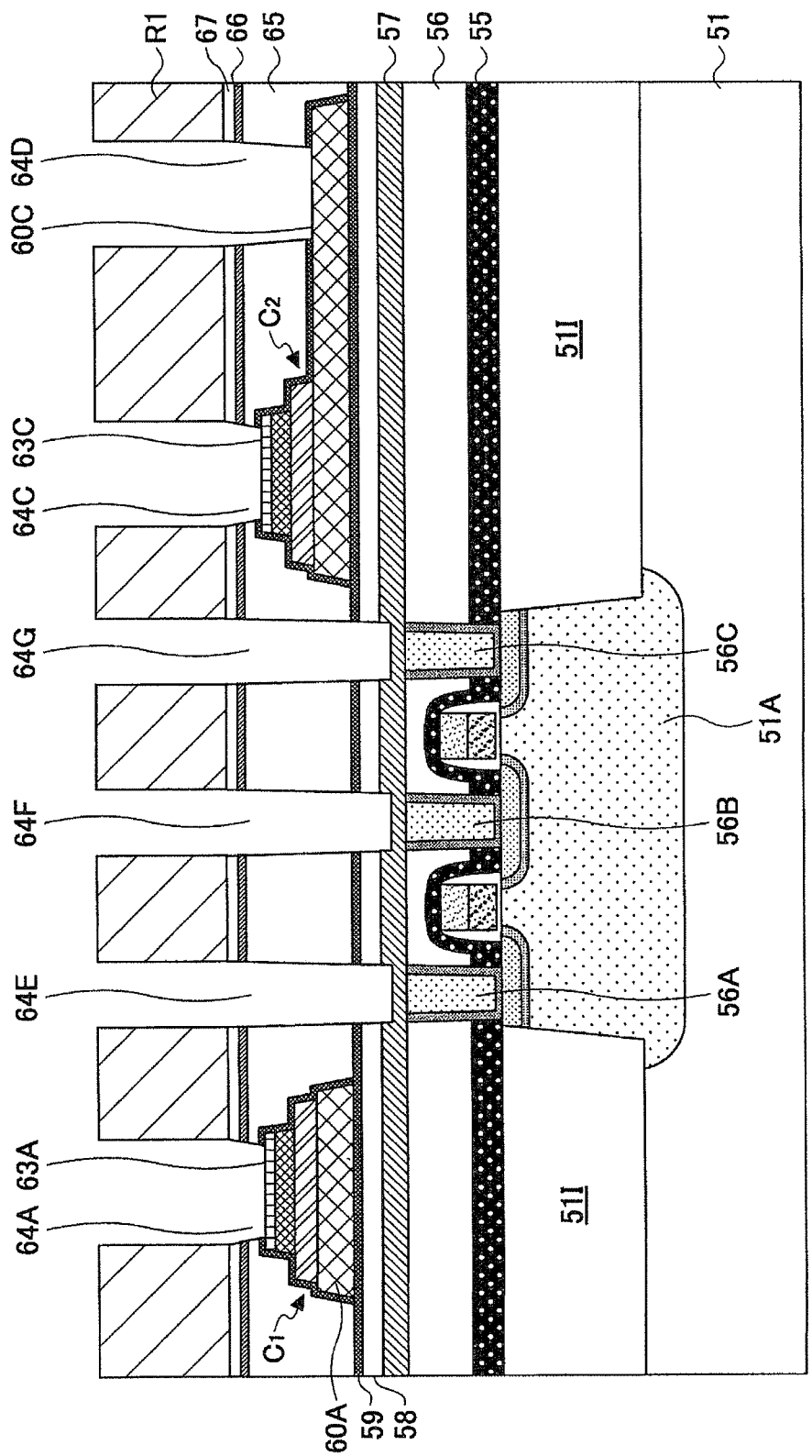

Further, in the step of FIG. 11E, the $Al_2O_3$ film 66 and the plasma TEOS film 67 are formed on the structure of FIG. 11D consecutively with respective thicknesses of 50 nm and 300 nm, and the openings 64A, 64C, 64D, 64E, 64F and 64G are formed by conducting an RIE process while using a resist pattern R1 as a mask, such that the openings 64A, 64C, 64D, 64E, 64F and 64G expose respectively the cap layer of the upper electrode of the ferroelectric capacitor C1, the cap layer 64C of the upper electrode of the ferroelectric capacitor C2, the lower electrode 60C of the ferroelectric capacitor C2, the conductive plug 56A, the conductive plug 56B and the conductive plug 56C, by penetrating through the interlayer insulation film 67, the $Al_2O_3$ film 66, the interlayer insulation film 65 and the $Al_2O_3$ film 64 in the part where the ferroelectric capacitors C1 and C2 are formed and further penetrating through the $Al_2O_3$ film 59, the interlayer insulation film 58 and the SiON film 57 in the part where the ferroelectric capacitors C1 and C2 are not formed. While not illustrated, it should be noted that an opening exposing the lower electrode 60A of the ferroelectric capacitor C1 is formed similarly in the step of FIG. 11F.

Next, in the step of FIG. 11G, the resist pattern R1 is removed, and the structure thus formed with the openings 64A and 64C-64G is annealed in an oxygen ambient at the temperature of 500° C. for 60 minutes, and the PZT films 61A and 61C are subjected to oxygen defect compensation. At the same time, water or hydrogen in the interlayer insulation film 65 is removed. Thereby, it should be noted that, because there are formed a large number of deep openings, particularly the openings reaching the SiON film 57, it becomes possible with the present embodiment to achieve removal of water or hydrogen with high efficiency. Thereby, because the conductive plugs 56A-56C underneath the openings 64E-64G are covered with the SiON anti-oxidation film 57, there is caused no oxidation in the conductive plugs 56A-56C.

Next, in the step of FIG. 11, the structure of FIG. 11G is etched back, and the conductive plugs 56A, 56B and 56C are exposed at the openings 64E, 64F and 64G.

Further, W plugs 67A, 67C, 67D, 65A, 65B and 65C are formed in the openings 64A and 64C-64G via respective barrier films 67a, 67c, 67d and 65a-65c, and with this, the structure explained with reference to FIG. 10 is obtained. For the barrier films 67a, 67c, 67d and 65a-65c, it is possible to use a sputtered TiN film of the thickness of 100 nm, for example. Further, the W plugs 65A-65C and 67A, 67C and 67D can be formed by filling the openings with a W film by a CVD process, followed by a CMP process.

According to the ferroelectric memory 50 of the present embodiment, the interlayer insulation film 65, in which the ferroelectric capacitors C1 and C2 are embedded, is processed with the effective dehydration processing and hydrogen removal processing, and because of this, there arises no problem of degradation of the PZT film 61A or 61C in the ferroelectric capacitor C1 or C2, even when a multilayer interconnection structure is formed on the structure of FIG. 10.

Figure 12:
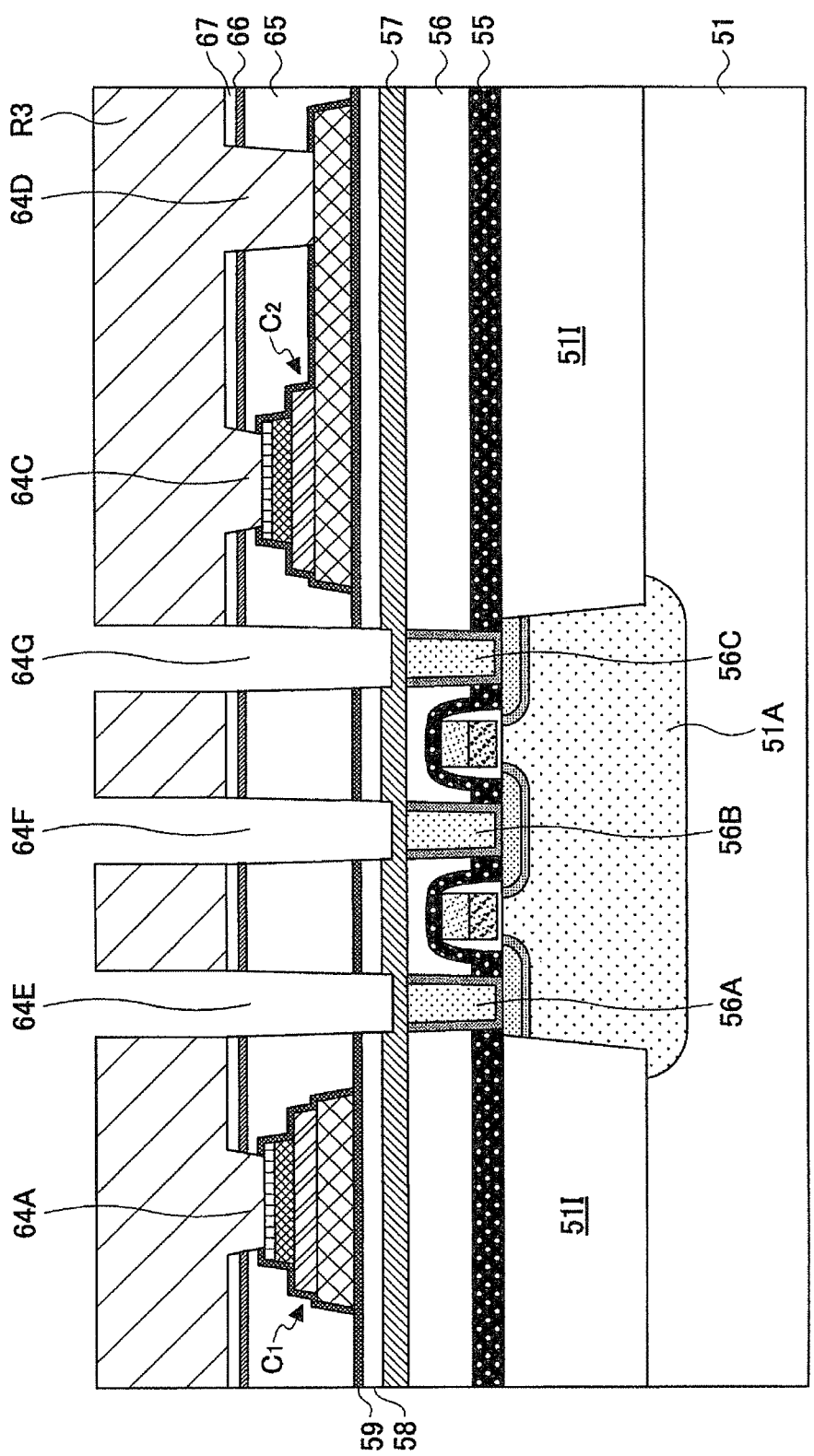
FIG. 12 is a diagram showing a modification of the third embodiment.

In the present embodiment, it is also possible to form the openings 64A, 64C and 64D in advance as shown in FIG. 12 and form the openings 64E-64G thereafter while using a resist pattern R3 as a mask. Thereby, it is possible to change the order of the process for forming the openings 64A, 64C and 64D and the process for forming the openings 64E-64G.

Figure 13:
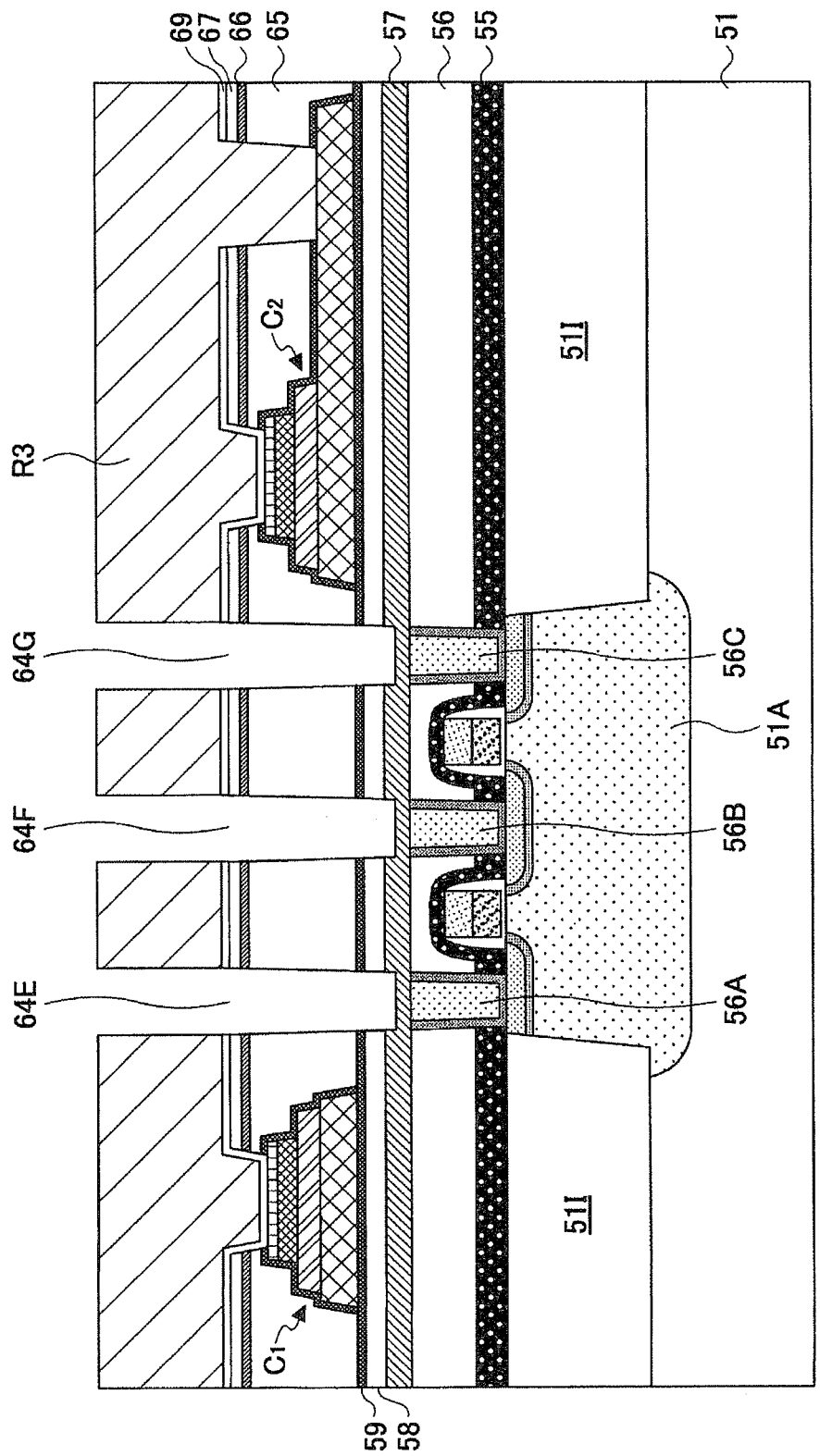
FIG. 13 is a diagram showing a further modification of the third embodiment.

Further, as shown in FIG. 13, it is also possible to form the TiN film 69 after formation of the openings 64A, 64C and 64D so as to cover the openings 64A, 64C and 64C. In this case, the TiN film 69 is patterned by the resist pattern R3, and the patterning of the films 67, 66 and 65 is carried out while using the TiN film 69 thus patterned as a hard mask. By forming such a TiN film 69, it becomes possible to suppress the reflection from the underling layers at the time of exposing the resist pattern R2, and thus, it becomes possible to control the shape of the contact holes to be formed with high precision. Further, by using such a hard mask pattern, it becomes possible to form the deep openings 64E-64G with high precision. Further, in the state of FIG. 13, it should be noted that the openings 64E-64G do not penetrate through the SION anti-oxidation film 57. Thus, there is no such a risk that the TiN barrier metal film is removed from the conductive plugs 56A-56C even when the TiN hard mask pattern 69 is removed by a wet processing after the formation of the openings 64E-64G.

In the present embodiment, too, it is possible to apply a nitridation processing to the sidewall surfaces of the openings 64A, 64C, 64D and 64E-64G by conducing a $N_2O$ plasma processing after the step of FIG. 11G.

While the present invention has been explained for preferred embodiments, the present invention is not limited to such specific embodiments and various variations and modifications may be made within the scope of the invention described in patent claims.

What is claimed is:

1. A method for fabricating a semiconductor device, said semiconductor device comprising a semiconductor substrate formed with an active element, an oxidation resistant film formed over said semiconductor substrate so as to cover said active element, a first interlayer insulation film formed over said oxidation resistant film, a ferroelectric capacitor formed over said first interlayer insulation film and having a construction of consecutively stacking a lower electrode, a ferroelectric film and an upper electrode; and a second interlayer insulation film formed so as to cover said ferroelectric capacitor, said method comprising the steps of:

forming first and second contact holes in said second interlayer insulation film so as to expose said upper electrode and said lower electrode, respectively;

forming an opening in said second interlayer insulation film so as to expose said oxidation resistant film such that a hydrogen barrier film covering said ferroelectric capacitor in conformity with a shape of said ferroelectric capacitor under said second interlayer insulation film is exposed at a sidewall of said opening in a state in which said oxidation resistant film is exposed at a bottom of said opening and such that said first interlayer insulation film is exposed at said sidewall of said opening in said state in which said oxidation resistant film is exposed at said bottom of said opening, conducting a thermal annealing process in an oxidizing ambient in a state in which said first and second contact holes and said opening are formed in said second interlayer insulation film; and exposing, after conducting the thermal annealing process, a lower conductive plug underneath said oxidation resistant film by removing said oxidation resistant film exposed at said opening; and filling said opening with a conductive plug.

2. The method as claimed in claim 1, wherein said opening is formed after said step of forming said first and second contact holes.

3. The method as claimed in claim 2, wherein said opening is formed by using a hard mask pattern formed on said second interlayer insulation film as a mask.

4. The method as claimed in claim 1, wherein said step of forming said first and second contact holes and said step of forming said opening are conducted simultaneously.

5. The method as claimed in claim 1, wherein a said hydrogen barrier film comprises an $Al_2O_3$ film or AlN film.

6. The method as claimed in claim 1, further comprising a step of plasma-nitriding sidewall surfaces of said first contact hole, said second contact hole and said opening after said thermal annealing process.

7. The method as claimed in claim 1, wherein said hydrogen barrier film exposed in said opening has a sidewall surface coincident to a sidewall surface of said opening.

* * * * *